United States Patent [19]
Bright et al.

[11] Patent Number: 5,357,404
[45] Date of Patent: Oct. 18, 1994

[54] EMI SHIELD, AND ASSEMBLY USING SAME

[75] Inventors: Edward J. Bright, Middletown; Jay F. Maltais, Harrisburg; Attalee S. Taylor, Palmyra, all of Pa.

[73] Assignee: The Whitaker Corporation, Wilmington, Del.

[21] Appl. No.: 156,520

[22] Filed: Nov. 22, 1993

Related U.S. Application Data

[63] Continuation of Ser. No. 991,611, Dec. 16, 1992, abandoned, which is a continuation-in-part of Ser. No. 845,405, Mar. 3, 1992, abandoned, which is a continuation-in-part of Ser. No. 793,769, Nov. 18, 1991, abandoned.

[51] Int. Cl.$^5$ ............................................. H05K 7/20
[52] U.S. Cl. ..................... 361/818; 24/458; 174/35 R; 174/51; 248/510; 257/718; 361/704; 439/607
[58] Field of Search ............. 439/485, 607, 259, 342; 174/16.3, 35 R, 35 C, 36, 51, 52.1; 257/706, 712, 713, 718, 719; 165/80.3, 185; 411/352, 520; 267/150, 160; 24/457, 458, 472, 625; 248/316.7, 505, 510; 361/816, 818, 690, 704, 709, 719, 720, 722, 773, 783

[56] References Cited

U.S. PATENT DOCUMENTS

| | | | |
|---|---|---|---|
| Re. 32,370 | 3/1987 | Bright et al. | 339/17 |
| 3,775,552 | 11/1973 | Schumacher | 174/105 |
| 4,404,617 | 9/1983 | Ohyama | 361/424 |
| 4,716,494 | 12/1987 | Bright et al. | 361/386 |
| 4,745,456 | 5/1988 | Clemens | 357/79 |
| 4,822,286 | 4/1989 | Bianca | 439/610 |
| 4,841,414 | 6/1989 | Hibino et al. | 361/424 |
| 4,846,727 | 7/1989 | Glover | 439/608 |
| 4,867,690 | 9/1989 | Thumma | 439/79 |
| 4,890,199 | 12/1989 | Beutler | 361/424 |
| 4,901,205 | 2/1990 | Landis et al. | 361/424 |
| 4,926,291 | 5/1990 | Sarraf | 361/384 |
| 4,988,310 | 1/1991 | Bright et al. | 439/342 |
| 5,014,160 | 7/1991 | McCoy, Jr. | 361/424 |
| 5,030,115 | 7/1991 | Regnier et al. | 439/108 |
| 5,031,028 | 7/1991 | Galich et al. | 357/81 |
| 5,053,924 | 10/1991 | Kurgan | 361/424 |
| 5,124,889 | 6/1992 | Humbert et al. | 361/424 |
| 5,241,453 | 8/1993 | Bright et al. | 361/704 |

FOREIGN PATENT DOCUMENTS 3203609  8/1983  Fed. Rep. of Germany ...... 361/386

OTHER PUBLICATIONS

High Speed–Dissipators, IERI, Thermal Management Products, Bull No. 503, Mar. 1991.

*High Speed Microprocessor Heat Dissipators*, IERC; Burbank, Calif.; Mar. 1991.

Primary Examiner—Gerald P. Tolin

[57] ABSTRACT

The assembly of an electronic package, a socket which holds the package, an electrically-conductive heat sink placed over and around the package, and an EMI shield for minimizing EMI leakage. The shield is a metal frame extending around the socket and package, and secured to it by locking tabs extending inwardly from the frame to detents on the edges of the socket. The socket contains double-wall structures spaced along its periphery which support the frame when it is on the socket, and the heat sink is provided with depending skirts which extend downwardly on all sides of the socket and package, to contribute additional EMI shielding. The sink is held to the socket by resilient retainers, each secured at one end to an upper surface of the heat sink and extending downwardly through the heat sink to be releasably secured to latching detents on the edges of the socket, by means of latches located inside the frame. The double-wall structures hold the frame outward from the latching detents sufficiently that the latches of the retainer fit between the edges of the socket and the inside of the frame.

13 Claims, 7 Drawing Sheets

EMI SHIELD, AND ASSEMBLY USING SAME

CROSS REFERENCE TO RELATED APPLICATIONS

This application is a Continuation of Application Ser. No. 07/991,611, now abandoned, filed Dec. 16, 1992, which is a continuation-in-part of application Ser. No. 07/845,405, filed Mar. 3, 1992, now abandoned, which is a continuation-in-part of application Ser. No. 07/793,769, filed Nov. 18, 1991, now abandoned.

FIELD OF THE INVENTION

This invention relates to devices which provide electromagnetic shielding for electronic packages and for the sockets on which they are mounted, to minimize electromagnetic interference (EMI). It relates especially to the shielding of such sockets and electronic packages which employ high frequency signals and are mounted on a substrate, for example on a printed circuit board, with a heat sink secured over the electronic package after it has been plugged into the socket.

BACKGROUND OF THE INVENTION

It is well known that electrical signals occurring within electronic packages, such as micro-processors, emit electromagnetic energy from the package, which can produce electromagnetic interference (EMI) undesirably affecting other electronic signals in nearby equipment. It is believed that the electrical sockets in which the packages are positioned also emit EMI as the signals from or to the electronic packages pass through the sockets. The amount of radiation being emitted from the sockets, if any, is as yet unknown, and further is expected to vary from one socket construction to another. It is desirable to provide a shield against such emission of EMI, and attempts at EMI shielding in general are well known.

In this connection, it is known to shield signal wires (e.g. U.S. Pat. No. 3,775,552 to Schumacher); to shield signal contact elements in two-piece connector systems (e.g., U.S. Pat. Nos. 4,846,727 to Glover et al. and 4,867,690 to Chumma); and to make connector-encompassing hoods of a shielding material as disclosed in U.S. Pat. No. 4,822,286 to Bionco.

It is further known from U.S. Pat. No. 5,030,115 to Regnier et al. to provide an elongated ground shield across the back faces of a pair of SIMM sockets stacked on top of each other in a socket carrier, and further to insert the shield across the back faces of and between two pair of SIMM sockets stacked in a carrier with each pair facing in an opposite direction. The shield prevents electrical interference being radiating from or received by the terminals of the SIMM sockets.

Disclosed in U.S. Pat. No. Re. 32,370 is a cover for a socket having arms, and having prying tabs on the arms and on depending members that lock the cover to the socket.

U.S. Pat. No. 4,716,494 discloses a spring clip whose latch sections are latched under latch projections.

In the above-identified two copending applications it is proposed to provide a shielding device adapted to be placed around the socket on which an electronic package is positioned, to suppress EMI emissions and further to ground a heat sink retained on the electronic package and thus prevent it from acting as an EMI antenna. However, the systems disclosed in those applications possesses limitations in some respects, particularly from the viewpoints of effectiveness of shielding, ease of assembly and disassembly, and commercial packaging of the shield and socket.

More particularly, shielding systems disclosed in these copending applications use a rectangular socket the peripheral portions of which are planar, except for latching detents provided to secure the latch means of heat-sink retainers, which are secured at one end to a covering heat sink and at their other ends to the latching detents. The shielding device used in those systems is an electrically-conductive frame which surrounds the socket and which has integral grounding or solder tails which extend from its bottom end; it also uses integral, heat-sink contacting, resilient tabs which extend outwardly from the frame to contact skirts which depend from two sides of the heat sink.

While operative for its intended purposes, such systems have some drawbacks. The frame is not securely attached to anything, and thus constitutes a separate and rather fragile piece which may be lost or damaged during storage, packaging, shipping, sale or assembly, and requires assembly by the customer. Further, in order to permit the heat-sink retainers to access the latching detents in the edges of the socket, the frame is cut out at the positions of the latching detents; these cut-outs tend to reduce the effectiveness of the EMI shielding effect. In addition, in order to leave the latching means clear for latching and delatching, the skirts of the thermally and electrically conductive heat sink depend from the sink downwardly on only two sides of the socket, namely those two sides not containing the latching detents, and this also tends to decrease the effectiveness of EMI shielding from what might otherwise be attainable if the skirts completely surrounded the electronic package on all sides.

The objects of the present invention therefore include providing a shielding device adapted to be secured to the socket, and which need not be cut out to accommodate the latch means; providing a socket which will mount and secure the shielding device, and which will cooperate in securing the heat-sink retainer means without requiring cut-outs in the shielding device; providing a heat sink which will permit the heat-sink retainer means to extend through the body of the heat-sink to the latching detents, without having to pass through the walls of the shielding device; and providing depending skirts on the heat sink which extend entirely around the socket, thus enhancing the EMI shielding. Other objects are to provide a socket structure which will support and protect the shielding device, and which will enable easy unlatching of the sink retainer means and removal of the shielding device, when desired, by application of a simple tool applied from above.

SUMMARY OF THE INVENTION

According to the present invention, a system is provided which assures that the shielding frame will be held securely to the socket after its initial assembly thereto, so the socket and frame may conveniently be handled and sold as a unit, although they can later be disassembled if desired for any reason; the frame is adapted to circumscribe completely the edge of the socket without requiring cut-outs in it to accommodate the latching arrangement used to fasten the retainer holding the heat sink in place, thus improving the effectiveness of the shielding. At the same time, the latching means is easily unlatched from the top to release the retaining means, thereby to permit easy removal and replacement of the electronics package when desired. Further, the skirts of the electrically-conductive heat sink extend completely around the socket, as is desired for best shielding.

In a preferred embodiment, the system employs an electrically conductive frame having grounding tails extending downwardly from its bottom edge which can be inserted through corresponding holes in a substrate, such as a printed circuit board, and connected, for example by soldering, to an appropriate common potential source here designated as ground, as is conventional; the shielding device also preferably comprises a plurality of resilient tabs spaced along its exterior for making contact to the adjacent interior walls of the depending skirt of the heat sink, as is also known. In accordance with the preferred embodiment of the invention, a plurality of resilient locking tabs are spaced along the interior sides of the frame to cooperate with corresponding detents on the edges of the socket, for releasably holding socket and shield together, once they are joined.

Further according to the invention, heat-sink retaining means are secured at one end to the heat sink and at the other end to latching detents on edges of the socket, at positions interior of the frame, i.e. inside the area bounded by the frame, so that the frame provides complete circumferential shielding without having to accommodate an exterior latch extending through the frame to the socket; accordingly, the frame can be optimized for its own intended purpose of sealing the assembly against EMI leakage. Importantly, this construction also permits the skirts depending from the electrically-conductive sink to extend completely around the socket and electronic package on all sides, further to enhance the EMI shielding.

To accomplish this in the preferred embodiment, double-wall structures are preferably provided along at least portions of the periphery of the socket, and preferably integrally with the socket, which provide downwardly-open slots into which the frame is advanced until its locking tabs snap over corresponding detents inside the slot, to hold socket and frame securely together; openings are provided in the top of the socket above the locking detents, through which a tool can be inserted to compress the tabs and thus release the frame from the socket, if for any reason this is desired.

The double-wall structures are interrupted at intervals where the resilient sink-contacting tabs are located, so that these tabs can expand outwardly and contact the adjacent downwardly-extending skirt of the heat sink. Also, the latching detents for holding the latches of the retaining means are spaced peripherally from the double-wall structures, and are located inside the region bounded by the frame; the ends of the retaining means opposite from the latches are secured to a top surface of the heat sink means, and the intermediate portion of each retaining means passes through the lower body portion of the heat sink to the socket. As mentioned above, the heat sink is provided with depending skirts on all sides, so that when installed it surrounds the socket and electronic package on all sides, to provide best shielding.

During assembly, the frame is slipped into the slot between the inner and outer walls of the double-wall structure of the socket, from the bottom, until the locking tabs snap into place; this assembly of socket and frame is then placed so that the solder tails of the frame extend into the substrate, and typically through it to the other side, where they are connected so as to ground the shield and thus the heat sink to which it makes contact. The socket pins similarly extend into the substrate, and are typically soldered to a printed circuit on the substrate. Thereafter, the electronics package is plugged into the socket with the retaining means passing through openings in the bottom of the heat sink; the latches of the retaining means are then latched to the edges of the socket, inside the shielding frame. Preferably a conventional thin, heat-transmissive, electrically-insulating blanket is placed between the electronics package and the heat sink before the heat sink is secured.

BRIEF DESCRIPTION OF FIGURES

These and other objects and features of the invention will be more readily understood from a consideration of the following detailed description, taken with the accompanying drawings, in which.

DETAILED DESCRIPTION OF PREFERRED EMBODIMENTS

Figure 1:
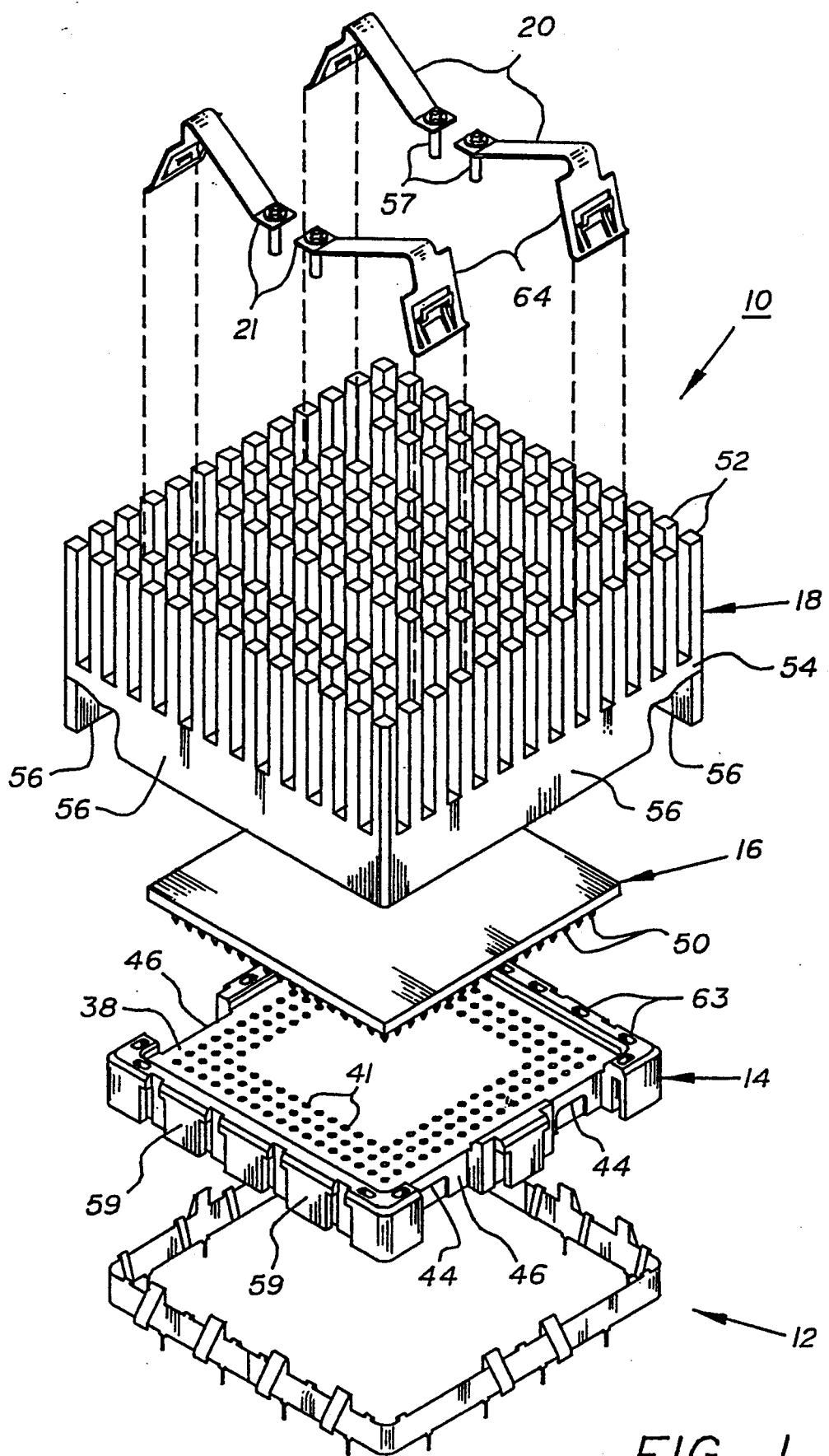
FIG. 1 is an exploded view of a complete assembly of shielding frame, socket, electronic package, heat sink and sink retainers according to the presently preferred embodiment of the invention.

A typical assembly 10 employing the shielding system of the present invention is shown in exploded view in FIG. 1. This assembly includes an electrically-conductive frame 12 surrounding the edge of a socket 14 for receiving the electronic package 16, which may for example contain a microprocessor chip. Package 16 may be, for example, a MIPS R 4000 PC 179 PGA, known in the industry. Also shown is a heat sink 18, which may for example be of aluminum, having an electrically insulating thermal interface blanket (not shown) on its lower side, and four sink retainers such as 20.

Figure 2:
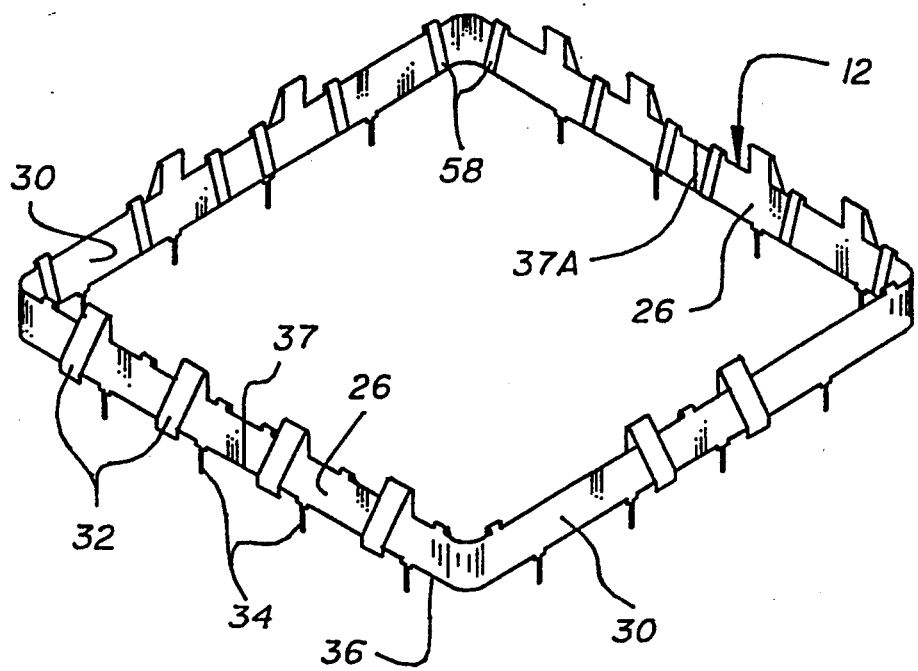
FIG. 2 is an isometric view of the shielding frame of FIG. 1.

Referring to FIG. 2, frame 12 includes a pair of parallel sidewalls 26 and a second pair of parallel sidewalls 30, each having a plurality of resilient cantilevered beams such as 32 projecting obliquely outwardly from the plane of the frame walls for contacting heat sink 18. All sidewalls 26, 30 are also provided with solder tails such as 34 projecting outwardly and downwardly from the lower frame edge 36 to enable convenient grounding of them and of the frame, and thereby also grounding the heat sink when it is in place in the assembly of FIG. 1.

Frame 12 is preferably stamped and formed from a suitable conductive and resilient material such as phosphor bronze or beryllium copper. It can be made in two or more pieces and joined or overlapped as shown at 37, 37A, for example, or can be made in a single piece. Its dimensions, i.e., the length and heights of sidewalls 26, 30 are determined primarily by the sizes of socket 14 and heat sink 18.

Solder tails 34 may be replaced by other means for electrically connecting device 12 to ground. Such other means (not shown) include leads which are frictionally received in holes in a substrate, solder feet for being surface soldered to circuit pads on a substrate, and fasteners such as nuts and bolts.

With reference again to FIG. 1, socket 14 includes a dielectric housing 38 having openings such as 41 containing recessed contact elements (not shown) from which leads 42, in the form of pins (FIG. 3), extend outwardly and downwardly from the socket. A pair of latch detent shoulders 44 comprising detent means are provided on each of the pair of opposite sidewalls 46 of socket 14, to which the heat-sink retainers 20 are latched, as described hereinafter. Electronic package 16 in this example includes leads such as 50 in the form of pins projecting outwardly and downwardly from the packaged microprocessor, for plugging into the contact elements in the socket.

Heat sink 18 includes cooling towers such as 52 projecting outwardly and upwardly from the base 54 of the sink, as well as four depending skirts 56 which extend downwardly from all four sides of the base. The towers are eliminated where the retainers 20 are located (see FIG. 8), so the retainers can lie along the top surface of the base.

Figure 7:
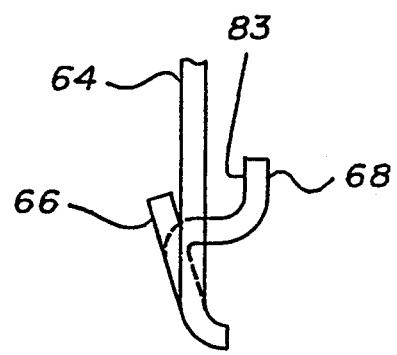
FIG. 7 is a fragmentary side view of the latch of FIG. 5.

Retainers 20 are made from a suitable material such as phosphor bronze and are shaped to provide necessary spring characteristics such that when latched to latching detents 44 they hold the heat sink tightly against the top of the electronic package, with an insulating blanket (not shown) between them. The retainers are secured at one of their ends, such as 21, to the top of base 54 (see FIG. 8) in any appropriate manner, in the present example by screws such as 57. At the other ends of the retainers are latch means such as latch members 64, each having a lance 66 and a screwdriver release catch 68 (see FIG. 7), whereby any of the latches can be released by placing a screwdriver tip in receptacle 83 on the inner side of the release catch 68 and prying the screwdriver. Such a latch is described in detail in the above-identified application Ser. No. 07/905,178.

Figure 3:
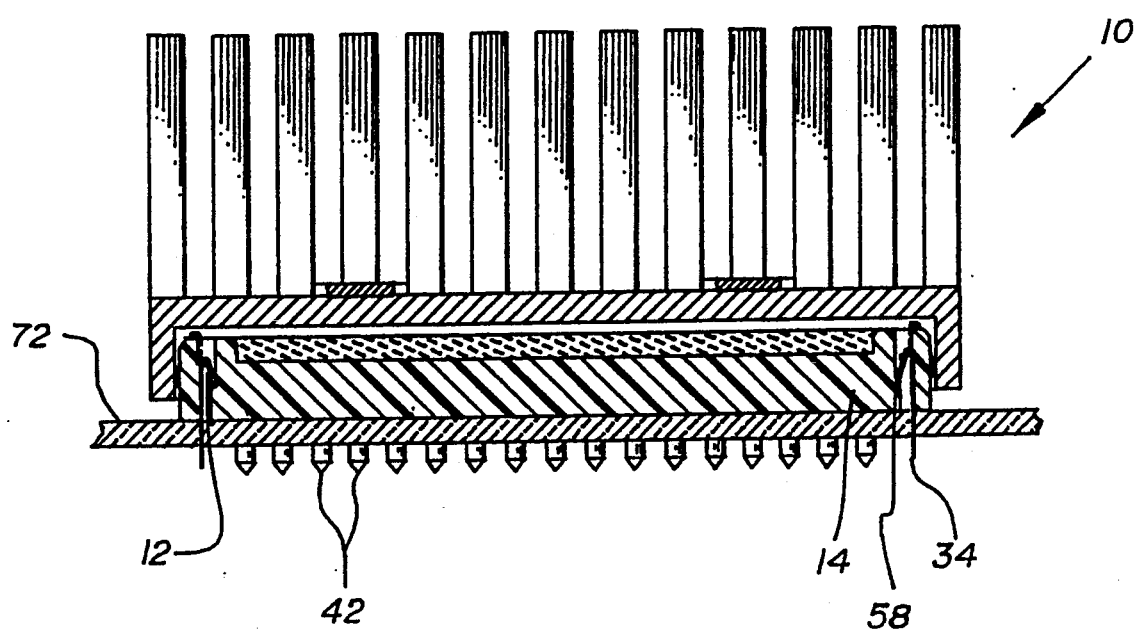
FIG. 3 is a vertical cross-sectional view of the assembly of FIG. 1 after the parts thereof have been placed together in operating position.
Figure 4:
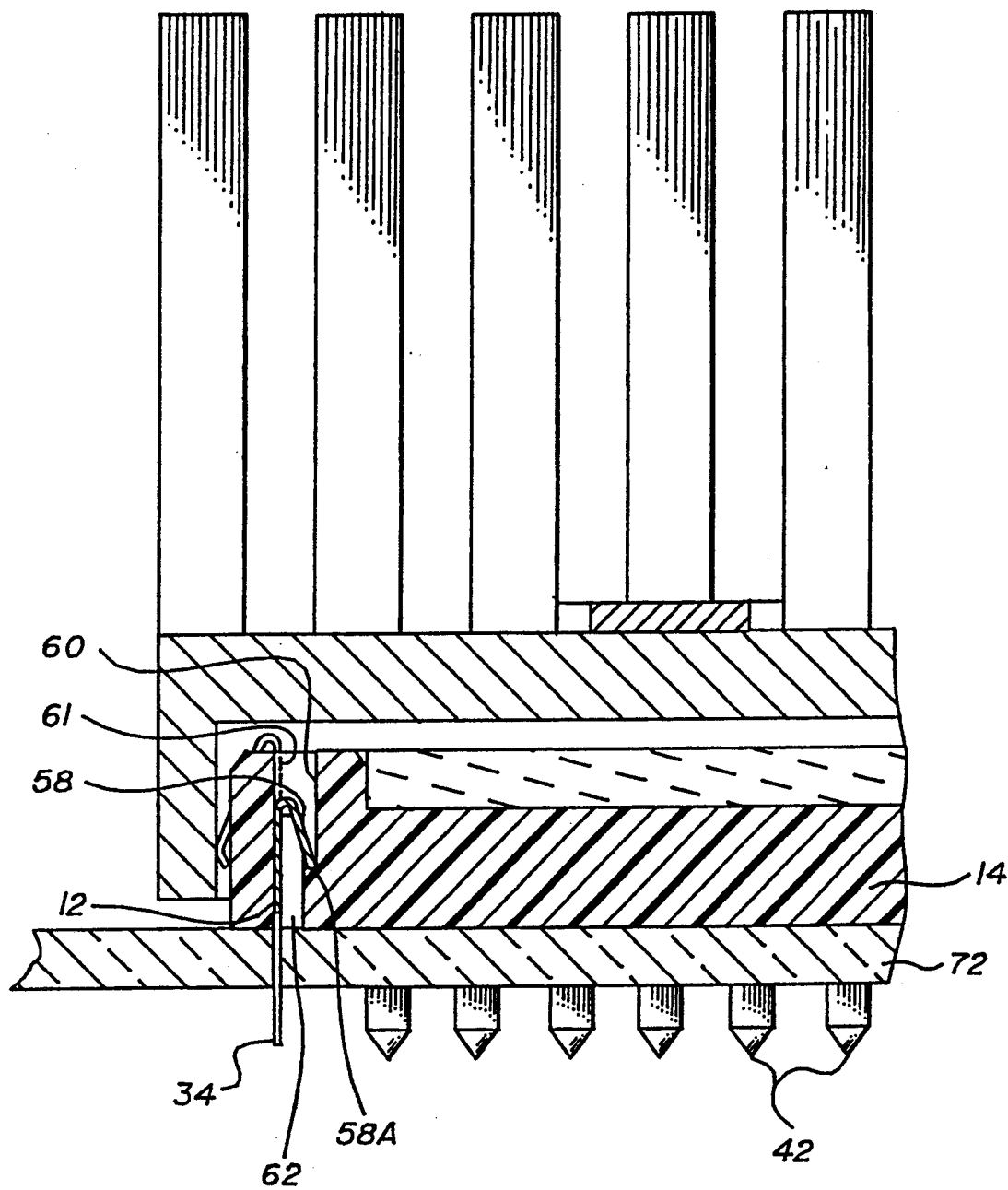
FIG. 4 is an enlarged fragmentary version of the left hand portion of the device of FIG. 3.
Figure 5:
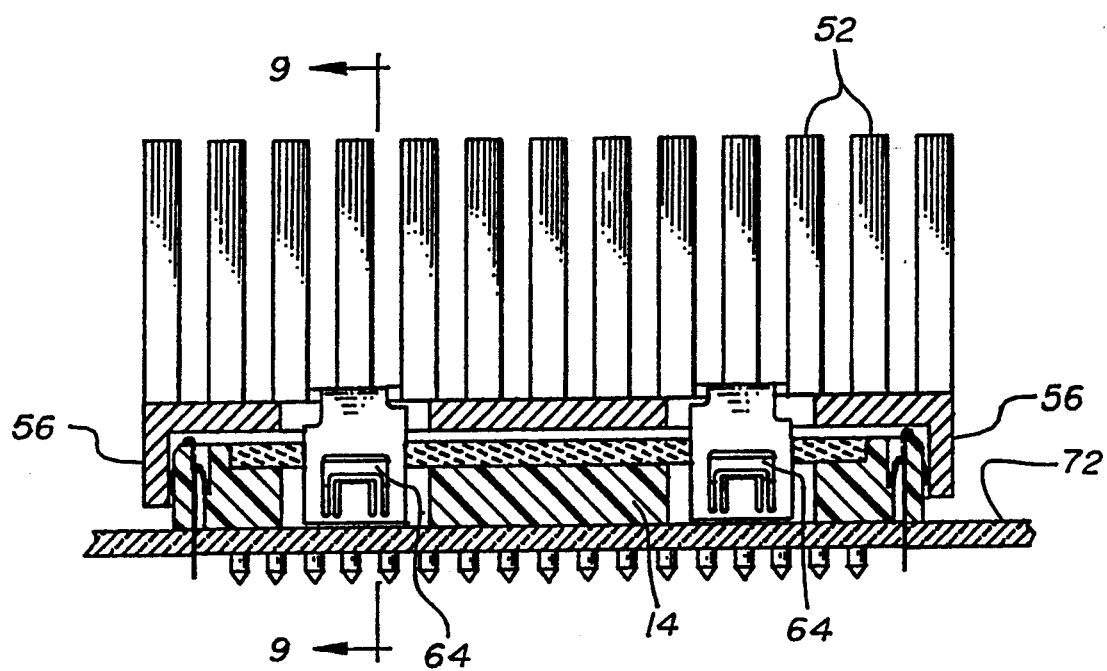
FIG. 5 is an enlarged fragmentary vertical sectional view of the assembly of FIG. 3.
Figure 6:
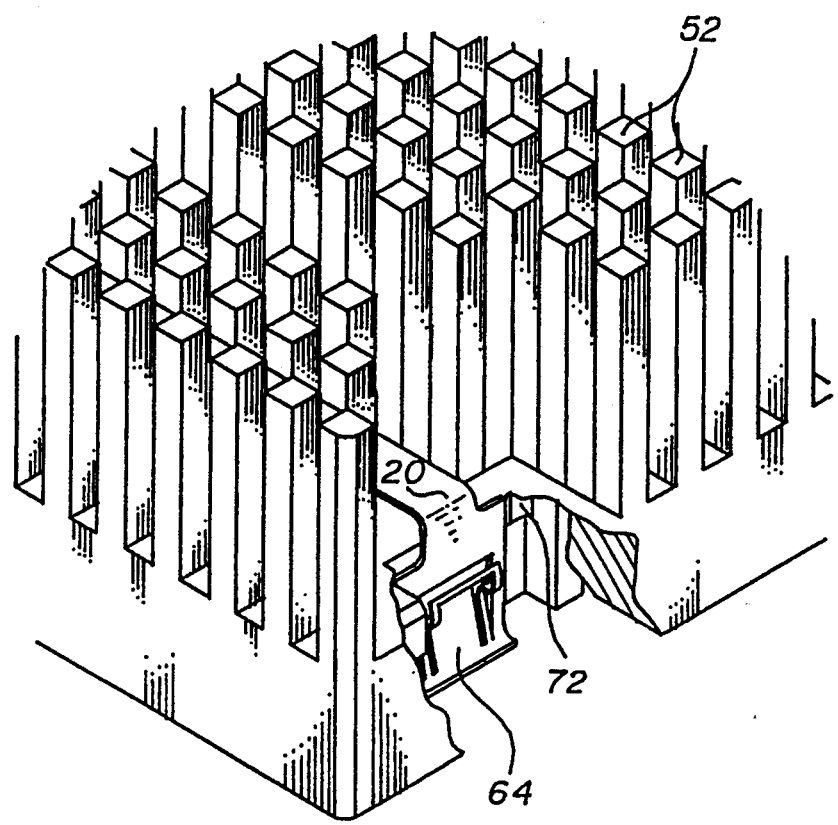
FIG. 6 is a fragmentary isometric view, with parts broken away, of the heat sink of FIG. 1.

FIGS. 3 and 4 show assembly 10 mounted on substrate 72, which may be a conventional printed circuit. Socket 14 is secured to substrate 72 by pin leads 42, which are either soldered in holes in the substrate or frictionally held therein. Leads 42 electrically engage circuits (not shown) carried by substrate 72. Shielding frame 12 surrounds socket 14 and is secured to substrate 72 by the solder tails 34, which are soldered to grounding connections on the substrate.

In use, electronic package 16 is placed on socket 14 with package leads 50 electrically engaging conventional contact elements (not shown) mounted within the contact housing 38 of the socket 14. Heat sink 18 is placed over electronic package 16, with a thin thermal interface or blanket (not shown) placed therebetween, and with the four skirts 56 extending downward outside the sidewalls 26, 30 of frame 12 and engaged by resilient contacting beams 32. The engagement between skirts 56 and beams 32 grounds the sink 18 to the ground circuits (not shown) of substrate 72, and prevents it from acting as an antenna.

In accordance with the invention, frame 12 may be of uniform height, having no cut-outs in it, and is provided with locking means such as spaced-apart resilient locking tabs 58 (FIG. 2) aligned with shoulder-like locking detents 58A (FIG. 4) on the edges of socket 14. Upon sliding of frame 12 upward about socket 14, the locking tabs 58 spring into detents 58A with a snap action, securely locking the frame against downward parting motion with respect to the socket, until such time as one may insert a small screwdriver-like tool into the locking detents from the top and twist it to pry the locking tabs from the shoulders of the locking detents, and thus release the frame for removal downwardly.

The socket 14 is provided at intervals along its periphery with an integral double-wall structure, as shown at 59 (FIG. 1) for example, the opposite interior walls 60 and 61 (FIG. 4) of which define between them downwardly-open slots 62 in which frame 12 is located. This double-wall structure is partially closed at its top to limit the upward motion of frame 12 (see FIG. 1) and thus determine its locked position on the socket; it also contains, on the outer side of its inner wall, the shoulder-like locking detents 58A which engage the locking tabs. Openings 63 (FIG. 1) in the top of the double-wall structure permit insertion of a tool for releasing the locking tabs, should one ever wish to do so.

The slots 62 (FIG. 4) are positioned outwardly from the retainer latching detents 44 (see FIG. 1) to hold the frame 12 sufficiently outward from the retainer latching detents 44 that the latches 64 can be inserted and latched to the edges of the socket inside the frame, without requiring cut-outs through the frame, thereby permitting the frame to retain its integrity as a shield.

Figure 8:
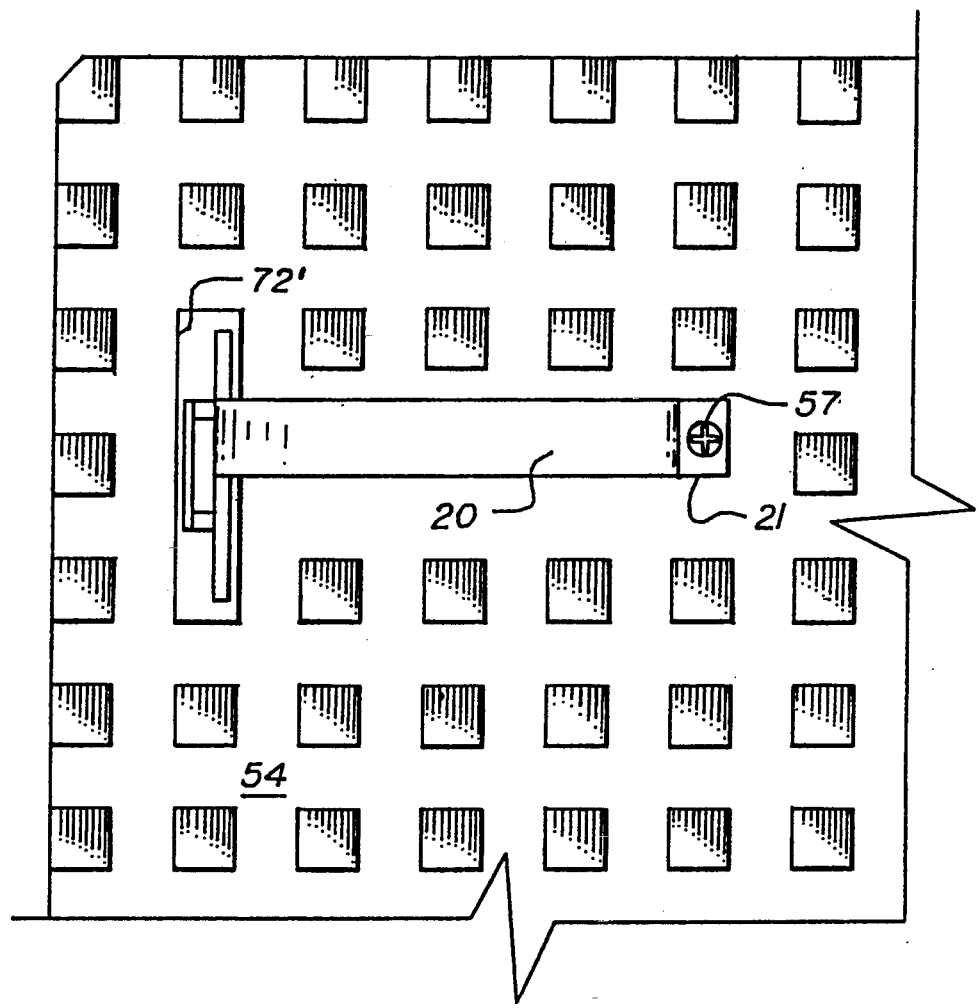
FIG. 8 is a fragmentary plan view of the heat sink showing one of the retainer means passing downwardly through the bottom of the heat sink.
Figure 9:
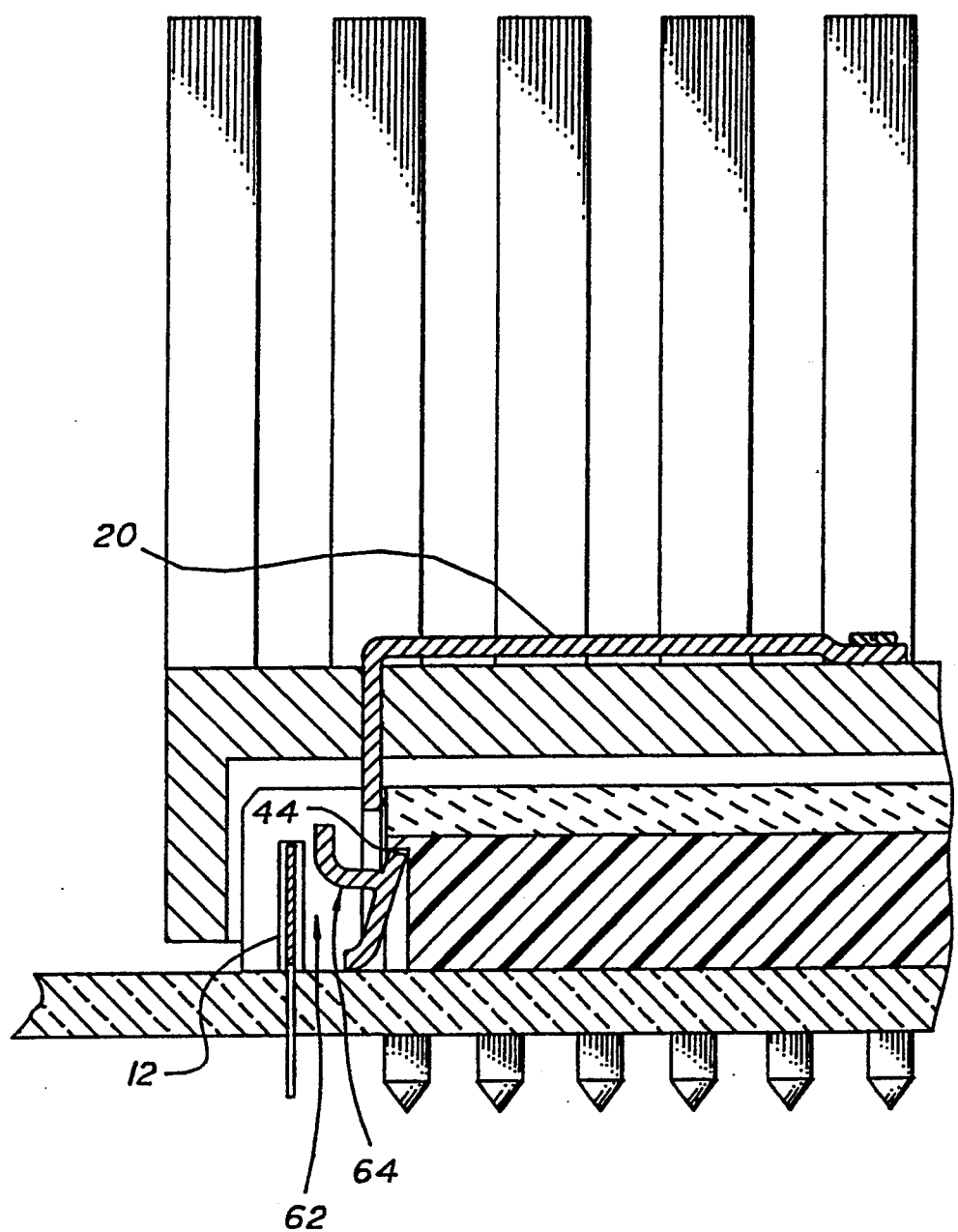
FIG. 9 is a vertical sectional view taken on lines 9—9 of FIG. 5, showing the retainer means passing downwardly through the heat sink and latched to the edge of the socket at a position within the confines of the frame.

The sink retainer means are in the form of four resilient retainers 20, each in the form of a resilient strap and secured at one end to the upper side of base 54, as by screws such as 57 (FIGS. 1 and 8). Each retainer is passed downwardly through a corresponding opening 72' in base 54 (FIG. 8), to be latched to the edge of the socket by means of the four corresponding latching detents 44.

Since the retainers do not have to extend outward around the depending skirts and then inward through cutouts in the frame to the latching detents, but instead pass through the heat-sink inside the frame, depending skirts can be provided on all sides of the heat sink, thus providing shielding of the socket on all sides, not only by the frame but also by the sink skirts.

There has therefore been provided a novel assembly of socket and frame in which the frame is securely but releasably fastened to the socket, whereby the socket and frame can be handled, stored, packaged, sold and used as a unit, rather than providing two separate pieces one of which, the frame, is quite fragile when unsupported. To enable this, a frame is provided which has resilient locking tabs on its inner side. Cut-outs are not needed in the frame, since the retaining arrangement of the invention does not require them.

A novel socket has also been provided which has a double-wall structure providing downwardly-facing slots into which the shielding frame is slid, to support the frame in position, and to lock it in place by means of locking detents on the socket. The novel socket also supports the frame in a position sufficiently outward from the latching detents that the latch means for the retainer can be slipped into place inside the boundary defined by the frame, and without requiring cut-outs on the frame.

The heat sink arrangement is also novel in this combination, having provisions whereby the sink-retaining means can pass downwardly through the sink to the latching detents, all inside the boundary defined by the frame, and skirts of the heat sink can extend downwardly on all sides of the socket to cooperate with the frame in providing the desired EMI shielding.

While the invention has been described with particular reference to specific embodiments in the interest of complete definiteness, it will be understood that it may be embodied in a variety of forms diverse from those specifically shown and described, without departing from the spirit and scope of the invention.

What is claimed is:

1. A socket having openings for receiving electrical leads of an electronic package to be mounted thereon, and adapted to receive and be secured to an electromagnetic shielding device including an electrically-conductive frame, said socket comprising:

an integral socket body having a central portion defining said openings;

said socket having double-wall structures at spaced apart intervals around a periphery thereof, said double-wall structures having inner and outer walls defining downwardly-open slots adapted to receive said frame therein;

outer surfaces of the inner walls defining detents cooperable with resilient locking tabs of said frame to secure said frame to said socket;

peripheral regions of said socket between said double-wall structures defining respective latching detents each for receiving a latch of a heat-sink retainer placed over said electronic package;

said socket being dimensioned such that said double-wall structures hold said frame at a distance from said latching detents sufficient to permit insertion of each said latch between said frame and its respective said latching detent.

2. The socket of claim 1, wherein tops of said double-wall structures define openings which provide access for a tool operable to disengage said locking tabs from their respective detents and thus release said socket from said frame.

3. The socket of claim 1, wherein said distance between said latching detents and said frame is sufficient to permit insertion of a tool from above to release each said latch from its respective said latching detent.

4. An electronic package assembly, comprising:

an electronic package having electrical leads extending therefrom and communicating electrically with the contents of said package;

a socket receiving said leads and holding said package on said socket;

a shielding device comprising an electrically-conductive frame surrounding peripheral portions of said socket and secured thereto, to minimize electromagnetic emissions from said assembly;

an electrically-conductive heat sink overlying said package for dissipating heat generated within said package; and retainer means extending from said sink to said socket and having releasable latch means securing one end of said retainer means to said socket;

said heat sink having a depending skirt extending downward therefrom and completely surrounding said socket outside of said shielding device;

said frame having means for electrically connecting with a ground circuit, and having electrically-conductive tabs extending outwardly from said frame and in contact with said skirt;

said retainer means extending from said sink downward, inside said frame and said heat-sink skirt, to at least one position on said socket inside of said frame; and detent means on said socket at said at least one position inside said frame, securing said latch means to said socket;

whereby said socket and said package are shielded on all sides.

5. The assembly of claim 4, wherein said frame comprises inwardly-projecting locking tabs which cooperate with detents defined by said socket to secure said frame to said socket.

6. The assembly of claim 5, wherein said socket comprises double-wall structures integral therewith and extending along at least portions of the periphery of said socket to form downwardly-open slots in which said shielding device is secured, the edges of said socket between said double-wall structures being recessed inwardly sufficiently for said latch means to be introduced between said socket and said frame to effect securing of said latch means to said socket.

7. The assembly of claim 6, wherein tops of said double-wall structures define openings which provide access for a tool operable to disengage said locking tabs from said detents and thereby release said shielding device from said socket.

8. The assembly of claim 6, wherein said latch means are releasable by a tool inserted from above, between said latch means and said shielding device.

9. An electronic package assembly, comprising:

a socket;

an electronic package mounted on the socket;

an electromagnetic shielding device comprising an electrically-conductive frame surrounding peripheral portions of said socket and secured thereto, said frame having means for electrically connecting with a ground circuit;

an electrically-conductive heat sink overlying said package for dissipating heat generated within said package, said heat sink having a depending skirt extending downward therefrom and completely surrounding said socket outside of said shielding device; and retainer means for securing said heat sink to said socket, said retainer means being connected to said heat sink and extending therefrom downwardly inside said frame and said heat sink skirt to at least one position on said socket, said retainer means having a releasable latch securing said retainer means to said socket at said at least one position;

said frame having electrically-conductive tabs extending outwardly from said frame in contact with said skirt;

whereby said socket and said package are shielded on all sides.

10. The assembly of claim 9, wherein said frame includes inwardly-projecting locking tabs which cooperate with detents defined by said socket to secure said frame to said socket.

11. The assembly of claim 10, wherein said socket includes double-wall structures defining downwardly-open slots at spaced apart intervals around a periphery of said socket, said shielding device is disposed between inner and outer walls of said double-wall structures, and said detents are defined by said inner walls.

12. The assembly of claim 11, wherein tops of said double-wall structures define openings which provide access for a tool operable to disengage said locking tabs from their respective said detents and thereby release said shielding device from said socket.

13. The assembly of claim 9, wherein said latch is releasable by a tool inserted from above, between said latch and said shielding device.

* * * * *